United States Patent
Lohmüller et al.

(10) Patent No.: US 11,508,863 B2
(45) Date of Patent: Nov. 22, 2022

(54) SEMICONDUCTOR COMPONENT AND METHOD FOR SINGULATING A SEMICONDUCTOR COMPONENT HAVING A PN JUNCTION

(71) Applicant: Fraunhofer-Gesellschaft zur Forderung der angewandten Forschung e.V., Munich (DE)

(72) Inventors: Elmar Lohmüller, Freiburg (DE); Ralf Preu, Freiburg (DE); Puzant Baliozian, Freiburg (DE); Tobias Fellmeth, Freiburg (DE); Nico Wöhrle, Freiburg (DE); Pierre Saint-Cast, Freiburg (DE); Florian Clement, Freiburg (DE); Andreas Brand, Freiburg (DE)

(73) Assignee: Fraunhofer-Gesellschaft Zur Förderung Der Angewandten Forschung E.V., Munich (DE)

( * ) Notice: Subject to any disclaimer, the term of this patent is extended or adjusted under 35 U.S.C. 154(b) by 0 days.

(21) Appl. No.: 17/279,171

(22) PCT Filed: Sep. 24, 2019

(86) PCT No.: PCT/EP2019/075603
§ 371 (c)(1),
(2) Date: Mar. 24, 2021

(87) PCT Pub. No.: WO2020/064670
PCT Pub. Date: Apr. 2, 2020

(65) Prior Publication Data
US 2022/0005964 A1 Jan. 6, 2022

(30) Foreign Application Priority Data

Sep. 24, 2018 (DE) .......................... 102018123485.6

(51) Int. Cl.
*H01L 31/068* (2012.01)
*H01L 23/31* (2006.01)
(Continued)

(52) U.S. Cl.
CPC ........ *H01L 31/068* (2013.01); *H01L 23/3171* (2013.01); *H01L 23/3185* (2013.01);
(Continued)

(58) Field of Classification Search
CPC ......... H01L 31/02167; H01L 31/02168; H01L 31/0216; H01L 31/02161; H01L 31/068; H01L 31/1868
See application file for complete search history.

(56) References Cited

U.S. PATENT DOCUMENTS 9,087,934 B2  6/2015  Lee et al.
2010/0319768 A1* 12/2010 Mitchell ......... H01L 31/022433
257/E31.124

(Continued)

FOREIGN PATENT DOCUMENTS

DE  102009026410  3/2011

OTHER PUBLICATIONS

Hermle M et al: "Analysis of Edge Recombination For High-Efficiency Solar Cells at Low Illumination Densities", Proceedings of the 3rd World Conference on Photovoltaic Energy Conversion: Joint Conference of 13th PV Science & Engineering Conference, 30th IEEE PV Specialists Conference, 18th European PV Solar Energy Conference; Osaka International Congress Cent, pp. 1009 to 1012, May 18, 2003 (May 18, 2003).

(Continued)

*Primary Examiner* — Golam Mowla
(74) *Attorney, Agent, or Firm* — Volpe Koenig

(57) ABSTRACT

A a semiconductor component (1a, 1b) having a front side and an opposite rear side and also side surfaces, and also at least one emitter (2a, 2b) and at least one base (3a, 3b), wherein a pn junction (4a, 4b) is formed between emitter (2a, 2b) and base (3a, 3b) and the emitter (2a, 2b) extends parallel to the front and/or rear side. At least one side surface is a passivated separating surface (T), at which a separating surface passivation layer (6a, 6b) is arranged, which has stationary charges having a surface charge density at the separating surface (T) with a magnitude of greater than or equal to $10^{12}$ cm-2. A method for singulating a semiconductor component (1a, 1b) having a pn junction is also provided.

10 Claims, 2 Drawing Sheets

(51) Int. Cl.
*H01L 31/0216* (2014.01)
*H01L 31/18* (2006.01)

(52) U.S. Cl.
CPC .... *H01L 31/02167* (2013.01); *H01L 31/1804* (2013.01); *H01L 31/1868* (2013.01)

(56) References Cited

U.S. PATENT DOCUMENTS

| | | |
|---|---|---|
| 2011/0124147 A1 | 5/2011 | Mayerhofer |
| 2013/0203239 A1 | 8/2013 | Fadeyev et al. |

OTHER PUBLICATIONS

Stefan Eiternick et al: "High Quality Half-cell Processing Using Thermal Laser Separation", Energy Procedia, vol. 77, pp. 340-345, Aug. 1, 2015 (Aug. 1, 2015).

Weinhold S et al:"Study of fast laser induced cutting of silicon materials", Visual Communications and Image Processing; Jan. 20, 2004; San Jose, vol. 8967, pp. 89671J-1-89671J-7, Mar. 6, 2014 (Mar. 6, 2014).

Sze, S.M., Physics of Semiconductor Devices, Second Edition, A Wiley-Interscience Publication, J. Wiley & Sons, Bell Laboratories, Incorporated, Murray Hill, New Jersey, pp. 380-381, 1981.

\* cited by examiner

SEMICONDUCTOR COMPONENT AND METHOD FOR SINGULATING A SEMICONDUCTOR COMPONENT HAVING A PN JUNCTION

TECHNICAL FIELD

The invention relates to a semiconductor component and to a method for singulating a semiconductor component comprising a pn junction.

BACKGROUND

In the production of semiconductor components, it is often desirable to singulate a plurality of semiconductor components produced on a substrate by virtue of the substrate being separated at at least one separating surface such that the semiconductor components are separated. Such singulation is necessary during the production of computing processors since a multiplicity of computing processors are typically produced on one silicon wafer. Moreover, there is increased use of a singulation of photovoltaic solar cells:

These days, photovoltaic modules are usually produced from silicon solar cells with an edge length of approximately 156 mm. Interconnection is implemented by electrically conductive connections by conducting elements—usually so-called cell connectors—which each connect solar cells on the front and back side in alternating fashion. A disadvantage of this interconnection is that the high current (up to approximately 10 A) of the individual solar cells requires a very high conductivity and consequently large conduction cross sections of the cell connectors.

A known option for circumventing this disadvantage lies in the provision of two or more solar cells on one silicon wafer in order to proportionally reduce the current per solar cell accordingly. These are only singulated toward the end of the processing in order for production to be able to use the large initial wafers as long as possible, and to hence keep productivity high and to be able to use established production equipment.

If furthermore, as described above, the solar cells are electrically connected by cell connectors, space which is not photovoltaically active and hence leads to a reduction in the module efficiency remains between the solar cells.

A known process for circumventing this disadvantage lies in the so-called shingling of the solar cells, in which the top side of one end of a solar cell is directly electrically connected to the bottom side of the next cell. To this end, the external contacts on the front and back side are realized at the respective opposite edges of the solar cells. Since usually no very highly conductive contact elements are present in the solar cell so as to minimize the shadowing and since the paths along which the current must flow in the contact fingers to the outer lying external contacts are very long for the shingling concept on the basis of large conventional solar cells, the silicon wafers are cut into thin strips following the processing of the solar cells such that, consequently, a plurality of photovoltaic solar cells with a typically rectangular form are realized in order to minimize power losses in the finger contacts of the solar cell in the case of shingling.

The singulation of the semiconductor components produced on a substrate, in particular on a silicon wafer, leads to an increase in the ratio of perimeter to area, and hence to an increase of area-normalized power losses due to edge recombination. Investigations have shown (J. Dicker, "Analyse and Simulation von hocheffizienten Silizium-Solarzellenstrukturen für industrielle Fertigungstechniken", Dissertation, University of Konstanz, 2003) that power losses arise, in particular, in the region where a pn junction meets a separating surface where singulation occurred. A reason for this, in particular, lies in the edge recombination in the quasi-neutral areas of emitter and base and, as described above, in the space charge region in particular. Additionally, the separation of the singulated semiconductor components at the produced edges leads to a significant increase in the recombination rate itself. This influence is particularly relevant if the semiconductor component has a high electronic quality on the other surfaces, in particular a lower recombination rate as a result of passivation layers or other passivation mechanisms.

There is therefore a need for singulating semiconductor components without substantially reducing the electronic quality of the semiconductor component due to the separating surface, in particular due to recombination effects at the separating surface.

In the case of silicon solar cells, it is known that a silicon dioxide layer natively growing at the separating surface reduces the negative influence at low illuminance levels (M. Hermle, J. Dicker, W. Warta, S. W. Glunz and G. Willeke, "Analysis of edge recombination for high-efficiency solar cells at low illumination densities", 2003, pp. 1009-1012). However, this only achieves a minor improvement in the case of silicon solar cells under standard illumination.

SUMMARY

The present invention is therefore based on the object of providing a semiconductor component and a method for singulating a semiconductor component such that a negative influence of the separating surface on the electronic quality is reduced.

This object is achieved by a semiconductor component and by a method having one or more of the features described herein. Advantageous embodiments are found in the following description and claims.

The method according to the invention is preferably embodied to produce a semiconductor component according to the invention, in particular a preferred embodiment thereof. The semiconductor component according to the invention is preferably formed by the method according to the invention, in particular a preferred embodiment thereof.

The semiconductor component according to the invention comprises a front side and an opposite back side and side faces. Furthermore, the semiconductor component comprises at least one emitter and at least one base, wherein a pn junction is formed between emitter and base. The emitter extends parallel to the front side and/or back side. Consequently, the semiconductor component can be formed as a photovoltaic solar cell or transistor, for example. The emitter can be formed in a manner known per se. In particular, emitters produced by diffusion and/or implantation and heteroemitters and emitters produced in epitaxial fashion lie within the scope of the invention.

What is essential is that at least one side face is a separating surface, at which a separating surface passivation layer is arranged. The separating surface passivation layer has stationary charges with a surface charge density with an absolute value greater than or equal to $10^{12}$ cm$^{-2}$. The surface charge density can consequently be electrically positive or negative. What is essential is that the absolute value of the surface charge density is greater than or equal to $10^{12}$ cm$^{-2}$, i.e., greater than or equal to $10^{12}$ cm$^{-2}$ in the case of positive charge and less than or equal to $-1 \times 10^{12}$ cm$^{-2}$ in the case of negative charge.

The invention is based on the discovery that the negative effects that occur at a separating surface can be reduced particularly efficiently by a separating surface passivation layer with a surface charge density with an absolute value of $\geq 10^{12}$ cm$^{-2}$. Passivation layers which reduce the surface recombination rate of charge carriers in the case of semiconductor components and, in particular, in the case of photovoltaic solar cells are known per se. However, investigations by the applicant have shown that the negative effects at the separating surface are reduced particularly efficiently by the above-described separating surface passivation layer. This is primarily due to the fact that stationary charges in the separating surface passivation layer prevent charge carriers in the semiconductor component, in particular in a silicon layer of the semiconductor component, from reaching the separating surface. In the case of a silicon layer, in particular, these charge carriers are kept away from the separating surface up to a depth of approximately 20 nm into the silicon. This is advantageous in that surface-near damage to the separating surface, which was caused by the separating process, is tolerable up to a depth of approximately 20 nm. As a rule, it is not possible to carry out mechanical separation without damaging a plurality of atomic layers of the surface of the semiconductor volume. However, it can be restricted to a depth of less than 20 nm by way of a suitable choice of process. Therefore, the method is advantageously carried out in such a way that the separation is implemented by one of the methods of TLS, LIC or LDC, explained below, as these methods have a comparatively low depth of damage.

Advantageously, the separating surface passivation layer covers at least the region where the pn junction borders the separating surface or, should the pn junction not reach up to the separating surface, where an extension of the pn junction to the separating surface meets the separating surface.

A particularly advantageous passivation of the separating surface is achieved by virtue of, in an advantageous embodiment, the separating surface passivation layer extending over the entire separating surface.

The semiconductor component according to the invention is advantageous in that the area of the semiconductor component can be used efficiently on account of the passivation of the separating surface by the separating surface passivation layer and hence the emitter can reach up to the separating surface. In particular, processes known in advance for avoiding negative influences of a separating surface, which have provided isolation by isolation trenches and/or a positioning of the pn junction at a distance from the separating surface by forming emitter windows, are not necessary or at least not mandatory. Although the positive effect can be increased by virtue of the pn junction not directly reaching up to the separating surface, a slight spacing is however sufficient for such an increase.

Advantageously, the pn junction therefore has a distance of less than 50 µm, in particular less than 20 µm, from the separating surface. In particular, it is advantageous for the pn junction to border the separating surface. This yields a simplified production method.

The separating surface passivation layer is preferably formed as a dielectric layer, in particular as an aluminum oxide layer, as a silicon nitride layer or as a silicon oxynitride layer. These layers can be produced in a manner known per se and can be provided with high surface charge densities. In particular, the scope of the invention includes the separating surface passivation layer being formed using one of the following methods:

CVD (see below);
ALD (see below);
printing technologies, in particular printing by screen printing, inkjet, extrusion or dispenser;
spray coating;
application of layer material onto the separating surface by a medium.

The semiconductor component can be formed as a transistor.

It is advantageous for the semiconductor component to be formed as a photovoltaic solar cell. This is because long lifetimes of minority charge carriers in emitter and base are required for high efficiencies, particularly in the case of photovoltaic solar cells, and so the passivation of a separating surface is of particular relevance here.

Therefore, the semiconductor component is advantageously formed as a photovoltaic solar cell comprising at least one silicon layer, in which at least the base is formed. In this context, the scope of the invention includes both emitter and base being formed in the silicon layer. Likewise, the arrangement of a separate layer, in particular a separate silicon layer, for forming the emitter on the base lies within the scope of the invention.

Advantageously, the separation of the semiconductor component at the separating surface is implemented in such a way that a damage zone with a small depth arises. In particular, it is advantageous for the semiconductor component to have at the separating surface a damage zone with a charge carrier lifetime, at least in the base, of <1 µs, wherein the damage zone has a thickness of <20 nm perpendicular to the separating surface. In particular, it is advantageous for the charge carrier lifetime to be a charge carrier lifetime of >10 µs, at least in the base in a region bordering the damage zone, as is conventional in photovoltaic solar cells.

The method according to the invention for singulating a semiconductor component comprising a pn junction includes the following method steps:

A semiconductor component which comprises at least one emitter and at least one base, wherein a pn junction is formed between emitter and base, is provided in a method step A.

In a method step B, the semiconductor component is singulated by separation into at least two partial elements at at least one separating surface.

What is essential is that, following method step B, a separating surface passivation layer is arranged at the separating surface and formed with a surface charge density, the absolute value of which is greater than or equal to $10^{12}$ cm$^{-2}$. As a result, the advantages specified in the description of the semiconductor component according to the invention arise The separating surface passivation layer is preferably formed to cover the entire separating surface in order to obtain a reduction, which is as efficient as possible, in the negative influences of the separating surface on the electronic quality of the semiconductor component.

The scope of the invention includes the singulation in method step B to be carried out by separation of the semiconductor component using a process known per se. Singulating the semiconductor component in the method step B can consequently be implemented in a manner known per se, in particular by one or more of the methods described below:

a) a chip saw method (W. P. Mulligan, A. Terao, D. D. Smith, P. J. Verlinden, and R. M. Swanson, "Development of chip-size silicon solar cells", in Proceedings of the 28th IEEE Photovoltaic Specialists Conference, Anchorage, USA, 2000, pp. 158-163);

b) creation of a trench by a laser with subsequent mechanical breaking (M. Oswald, M. Turek, J. Schneider, and S.

Schönfelder, "Evaluation of silicon solar cell separation techniques for advanced module concepts", in Proceedings of the 28th European Photovoltaic Solar Energy Conference and Exhibition, Paris, France, 2013, pp. 1807-1812);

c) thermal laser separation (TLS): M. Oswald, M. Turek, J. Schneider, and S. Schönfelder, "Evaluation of silicon solar cell separation techniques for advanced module concepts", in Proceedings of the 28th European Photovoltaic Solar Energy Conference and Exhibition, Paris, France, 2013, pp. 1807-1812; S. Eiternick, F. Kaule, H.-U. Zühlke, T. Kießling, M. Grimm, S. Schoenfelder, and M. Turek, "High quality half-cell processing using thermal laser separation", Energy Procedia, vol. 77, pp. 340-345, 2015.

d) laser induced cutting (LIC): S. Weinhold, A. Gruner, R. Ebert, J. Schille, and H. Exner, "Study of fast laser induced cutting of silicon materials", in Proc. SPIE 8967, Laser Applications in Microelectronic and Optoelectronic Manufacturing (LAMOM), San Francisco, USA, 2014, 89671J.

Investigations have shown that it is particularly advantageous to use TLS or LIC to carry out the singulation in method step B. The TLS method is based on a short laser trench being created by a first laser beam, which then leads to a separation of the wafer by introduced thermomechanical stress on the basis of simultaneous heating (e.g., by a second laser beam) and cooling (e.g., by an air-water mixture) along the edge to be created in any direction. In particular, this allows a separating surface that is independent of the crystal orientation of the wafer to be separated. The LIC method is quite similar to the TLS method but without active cooling tracking the heating (e.g., by a laser beam) in LIC. The LIC method is also known as the LDC (laser direct cleaving) method.

In particular, the method according to the invention is advantageous in that the singulation can be implemented after the completion or at least substantial completion of the semiconductor component. Therefore, prior to method step B, a passivating layer is advantageously applied to a front side and/or back side of the semiconductor component. In particular, it is advantageous if, prior to method step B, one or more metallic contacting structures for supplying and/or carrying away charge carriers were applied to a front side and/or a back side of the semiconductor component.

To improve the passivation quality of the separating surface passivation layer, it is advantageous for there to be a temperature treatment of the separating surface passivation layer following the application of the separating surface passivation layer, in particular heating to a temperature greater than or equal to 150° C. for a period of at least 1 min.

To improve the passivation quality, it may moreover be advantageous to carry this out in a defined atmosphere, in particular in a hydrogen-containing atmosphere.

The temperature treatment can be implemented globally by virtue of heating the entire semiconductor component. In an advantageous embodiment, the temperature treatment of the separating surface passivation layer is implemented by successive local heating, in particular by a laser. Consequently, in this case, local portions of the separating surface passivation layer are heated in succession, particularly preferably in a hydrogen-containing atmosphere as specified above.

As described above, the method according to the invention is particularly advantageously applicable to the singulation of photovoltaic solar cells. Therefore, the semiconductor component is preferably formed as a photovoltaic solar cell; in particular, at least the base is preferably formed in a silicon layer.

In a further advantageous configuration, the separating surface passivation layer is additionally formed at at least the front side or at least the back side of the semiconductor component. This is advantageous in that the separating surface passivation layer can be additionally used with a further function at the front side and/or back side. Particularly when the semiconductor component is formed as a photovoltaic solar cell, an application of the separating surface passivation layer to the side facing the incident radiation during the use of the solar cell, in particular to the front side, as a further optical layer can lead to an increase of the light input coupling in the solar module. Therefore, the method according to the invention preferably includes additionally forming the separating surface passivation layer on the front side and/or back side of the semiconductor component, in particular during the production of the separating surface passivation layer on the separating surface.

In particular, it is advantageous that, as described above, a passivating layer is applied to at least one side of the semiconductor component and the separating surface passivation layer is applied to the passivating layer and to the separating surface to be passivated. In particular, it is advantageous to additionally form the passivating layer as a charge carrier barrier layer. This avoids a formation of stationary charges in the separating surface passivation layer at the surface where the separating surface passivation layer covers the charge carrier barrier layer. This is due to the fact that the charge carrier barrier layer acts as a tunnel barrier, no charge carriers from the semiconductor can penetrate into the separating surface passivation layer and hence the separating surface passivation layer is unable to form stationary charges. Advantageously, the charge carrier barrier layer is embodied as a dielectric layer, in particular as a silicon nitride layer, silicon oxide layer, silicon oxynitride layer or aluminum oxide layer.

A further advantage of the present method is that the separating surface need not necessarily lie parallel to a preferred direction, in which a semiconductor substrate of the semiconductor component has the weakest bonds. In the case of a monocrystalline silicon wafer, a break line during breaking typically occurs at a 45° direction to an edge of the silicon wafer since there are fewer bonds in this direction on account of the crystal orientation. However, the present method facilitates separating surfaces at any desired angle, in particular separating surfaces parallel to an edge of the silicon wafer.

Preferably, the separating surface is therefore parallel to an edge of the semiconductor component, in particular of a silicon wafer of the semiconductor component.

BRIEF DESCRIPTION OF THE DRAWINGS

Further advantageous features and embodiments of the present invention are explained below on the basis of exemplary embodiments and the figures. In detail.

DETAILED DESCRIPTION

The figures show schematic illustrations that are not true to scale. In particular, the widths and thicknesses of the individual layers do not correspond to the actual conditions in order to provide a better representation.

Figure 1A:
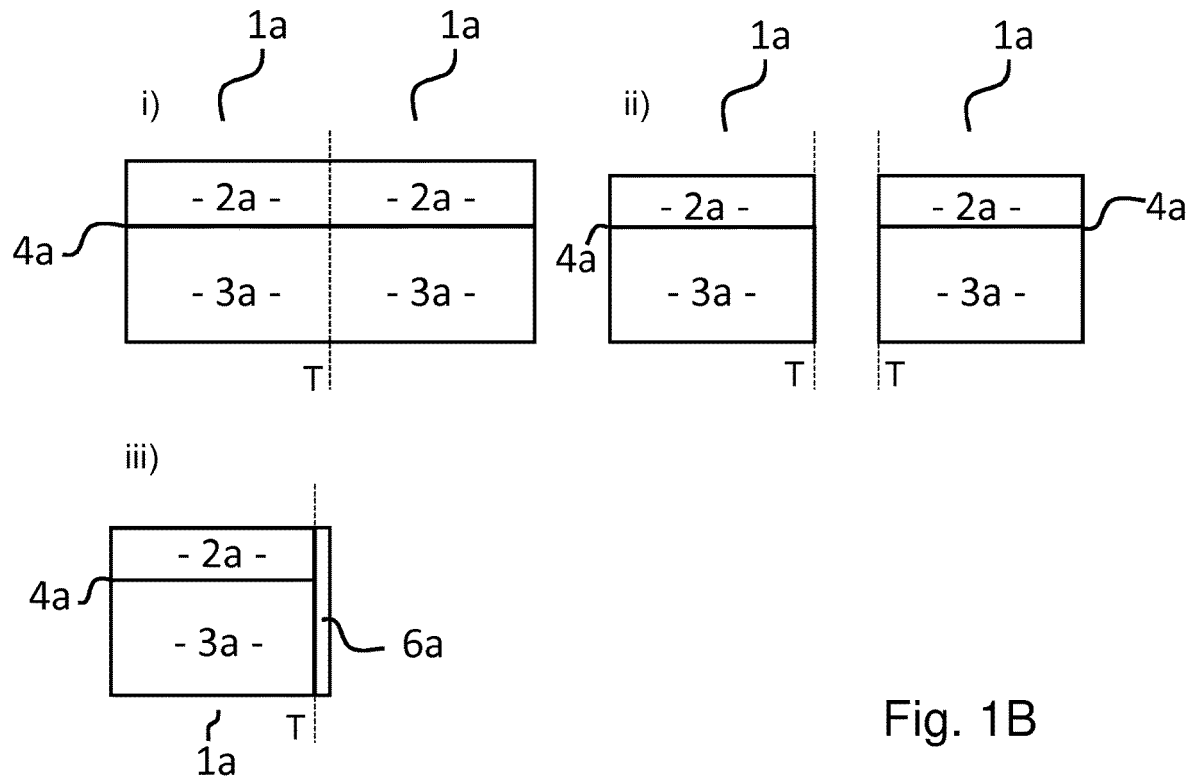
FIGS. 1A and 1B show two exemplary embodiments of semiconductor components according to the invention and partial steps of two exemplary embodiments of methods according to the invention.
Figure 1B:
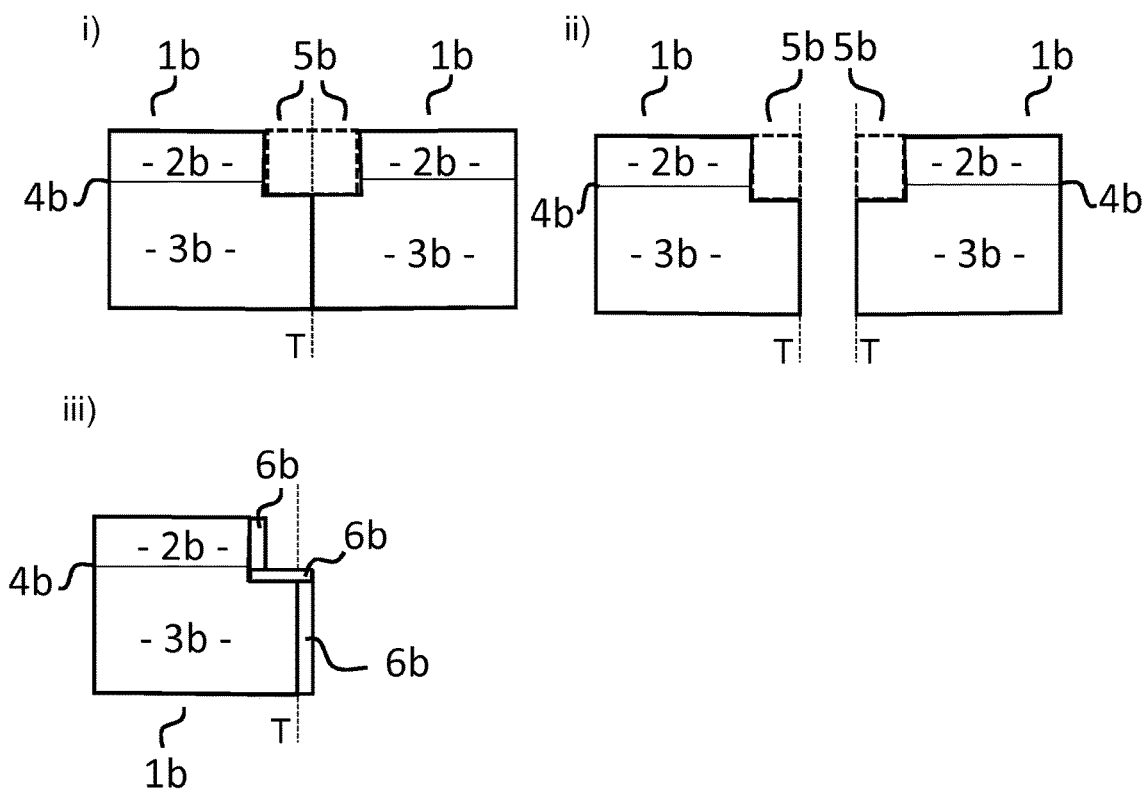

FIGS. 1A and 1B shows two exemplary embodiments A and B, in each case with partial steps of an exemplary embodiment of a method according to the invention. Accordingly, a first exemplary embodiment of a semiconductor component according to the invention is illustrated in FIG. 1A, at iii and a second exemplary embodiment of a semiconductor component according to the invention is illustrated in FIG. 1B, at iii.

Semiconductor components in the form of photovoltaic solar cells are mentioned below as exemplary embodiments. Likewise, the illustrated semiconductor components can be formed as transistors in a modification of the exemplary embodiments.

The first exemplary embodiment of a method according to the invention is explained on the basis of the partial steps illustrated in FIG. 1A:

In a method step A, the semiconductor component 1a is provided. In the present case, it comprises an n-doping type emitter 2a formed from the vapor phase by diffusion and, accordingly, a base 3a, which is doped with a p-doping type dopant. Accordingly, a pn junction 4a is formed between emitter 2a and base 3a. Emitter and base were formed in a silicon wafer. Furthermore, additional components, known per se, of a solar cell were already produced: This comprises passivation layers at the front side, located at the top, and at the back side, located at the bottom, metallization structures at the front side and back side for carrying away charge carriers and antireflection coatings at the front side and possibly back side for increasing the light absorption. In a modification of the exemplary embodiment, the emitter is formed by diffusion from a doping layer applied in advance or by implantation. Likewise, the doping types of emitter and base can be interchanged.

Subsequently, a singulation by separation is implemented at the separating surface T in a method step B by the above-described TLS method. The separating surface T is perpendicular to the plane of the drawing in FIGS. 1A and 1B and consequently passes through the base 3a and emitter 2a.

The TLS method is carried out proceeding from the back side, i.e., first a laser is used to form an initial trench on the back side, located at the bottom, in the region where the separating line T intersects the back side. The initial trench starts at an edge of the semiconductor component. The initial trench does not extend over the entire width of the semiconductor component. Typical initial trenches have a length ranging from 200 μm to 4 mm, typically less than 2 mm. Subsequently, the semiconductor component is separated, as described above, by simultaneous heating and cooling. In a modification of the exemplary embodiment, the TLS method is implemented starting from the front side so that the solar cell need not be rotated during the process.

The result is illustrated in FIG. 1A, at ii: Consequently, two mirror symmetric semiconductor components are produced, which each have a pn junction 4a that borders the separating surface T.

Following method step B, a separating surface passivation layer 6a is formed at the separating surface T. The formation is implemented by chemical vapor deposition (CVD), as is typical in industry, or, in a modification, implemented by atomic layer deposition (ALD).

The separating surface passivation layer 6a consequently extends over the entire separating surface T. The separating surface passivation layer is formed as an aluminum oxide layer with a surface charge density at the interface to the separating surface T with an absolute value of $\geq 10^{12}$ cm$^{-2}$, $-3 \times 10^{12}$ cm$^{-2}$ in the present case, and has a thickness from a few atomic layers over a few nm up to several 10 nm, 6 nm in the present case.

FIG. 1B shows a second exemplary embodiment of a method according to the invention. To avoid repetition, only the substantial differences are discussed below:

The semiconductor component 1b likewise comprises an emitter 2b and a base 3b such that a pn junction 4b is formed between emitter and base. However, a transverse conduction avoidance region 5b is formed in a method step BO between method steps A and B as described above, i.e., before singulation in particular. As is evident from FIG. 1B, at i, a transverse conduction avoidance region 5b formed as a separating trench is formed by laser ablation and it completely passes through both the emitter 2b and the pn junction 4b. This avoids the transverse conduction of charge carriers through the emitter to the separating surface T and consequently additionally reduces a negative influence, which reduces the electronic quality of the semiconductor component, of the separating surface.

As is evident from FIG. 1B, at 2ii, there subsequently is a separation and hence singulation of the semiconductor component at the separating surface T, in a manner analogous to the first exemplary embodiment. In this exemplary embodiment, the separation is implemented by the above-described LIC method.

As is evident from FIG. 1B, at 3iii, the separating surface passivation layer 6b is subsequently applied. In the present case, the latter is formed as an aluminum oxide layer with a surface charge density at the interface to base and emitter with an absolute value of greater than or equal to $10^{12}$ cm$^{-2}$, approximately $-3 \times 10^{12}$ cm$^{-2}$ in the present case, and has a thickness from a few atomic layers over a few nm up to several 10 nm, 6 nm in the present case. The separating surface passivation layer 6b was produced by ALD. As a result, there is a formation not only at the separating surface T but likewise at the walls of the transverse conduction avoidance region 5b, which is formed as a separating trench.

In order to provide a better representation, FIGS. 1A and 1B only illustrate one separating surface in each case.

When singulating photovoltaic solar cells, for example to form modules in accordance with the shingling technique mentioned at the outset, there usually is a singulation of a plurality of solar cells starting from a silicon wafer.

Figure 2:
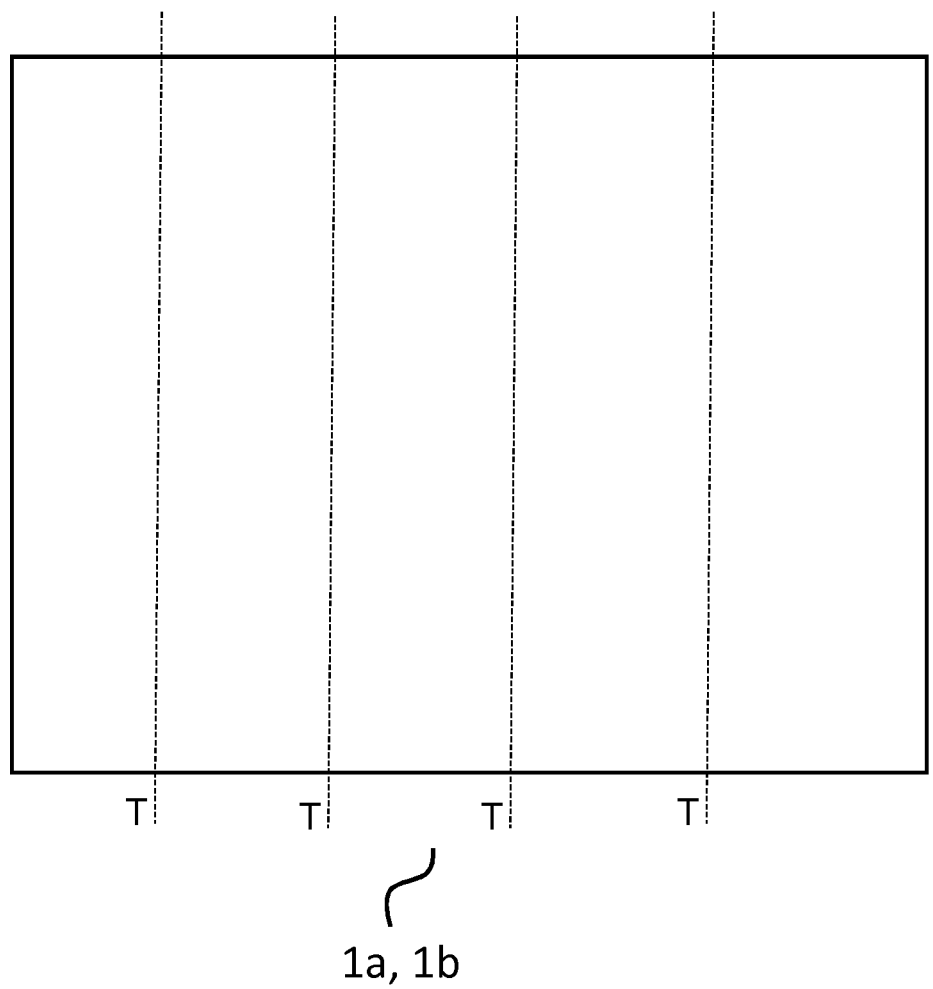
FIG. 2 shows a plan view from above on a semiconductor wafer for elucidating the position of the separating surfaces.

FIG. 2 illustrates a schematic plan view from above on a silicon wafer, in which photovoltaic solar cells were formed. One of the above-described methods is carried out at a plurality of separating surfaces T, four in the present case, and so five semiconductor components are available following singulation.

LIST OF REFERENCE SIGNS 1a, 1b Semiconductor component
2a, 2b Emitter
3a, 3b Base
4a, 4b pn junction
5b Transverse conduction avoidance region
6a, 6b Separating surface passivation layer
T Separating surface

The invention claimed is:

1. A method for singulating a semiconductor component (1a, 1b) having a pn junction (4a, 4b), comprising the method steps of:

A. providing a semiconductor component (1a, 1b) comprising at least one emitter (2a, 2b) and at least one base (3a, 3b), wherein a pn junction (4a, 4b) is formed between the at least one emitter (2a, 2b) and the at least one base (3a, 3b), B. singulating the semiconductor component (1a, 1b) by separation into at least two partial elements at at least one separating surface (T), following method step B, arranging a separating surface passivation layer (6a, 6b) at the separating surface (T) that is formed with stationary charges with a surface charge density, an absolute value of which is greater than or equal to $10^{12}$ cm$^{-2}$, wherein in process step B the separation takes place such that the pn junction (4a, 4b) borders the at least one separation surface (T), prior to process step B, applying a passivating layer to at least one of a front side or a rear side of the semiconductor component (1a, 1b), prior to process step B, applying one or more metallic contacting structures to at least one of the front side or the rear side of the semiconductor component (1a, 1b), and wherein the separation surface is parallel to an edge of the silicon wafer.

2. The method as claimed in claim 1, further comprising forming the separating surface passivation layer (6a, 6b) to cover the entire separating surface (T).

3. The method as claimed in claim 1, further comprising, in method step B, implementing the singulation by thermal laser separation (TLS, LIC or LDC).

4. The method as claimed in claim 1, further comprising carrying out a temperature treatment of the separating surface passivation layer (6a, 6b) following the application of the separating surface passivation layer (6a, 6b).

5. The method as claimed in claim 4, wherein the temperature treatment is implemented by successive local heating.

6. The method as claimed in claim 4, wherein the temperature treatment is carried out in a hydrogen-containing atmosphere.

7. The method as claimed in claim 1, wherein the separating surface passivation layer is additionally applied to at least one of the front side or the rear side of the semiconductor component.

8. The method as claimed in claim 1, wherein the semiconductor component (1a, 1b) is formed as a photovoltaic solar cell.

9. The method as claimed in claim 4, wherein the temperature treatment comprises heating the separating surface passivation layer (6a, 6b) to a temperature greater than or equal to 150° C. for a period of at least 1 min.

10. The method as claimed in claim 8, wherein at least the base (3a, 3b) is formed in a silicon layer.

* * * * *

UNITED STATES PATENT AND TRADEMARK OFFICE
CERTIFICATE OF CORRECTION

PATENT NO. : 11,508,863 B2
APPLICATION NO. : 17/279171
DATED : November 22, 2022
INVENTOR(S) : Lohmüller et al.

Page 1 of 1

It is certified that error appears in the above-identified patent and that said Letters Patent is hereby corrected as shown below:

On the Title Page

Item (72). INVENTOR: Line 6, after "Pierre Saint-Cast" delete "Florian Clement, Freiburg (DE); Andreas Brand, Freiburg (DE)" and insert -- ; Armin Richter, Freiburg (DE) --.

Signed and Sealed this
Twenty-seventh Day of May, 2025

Coke Morgan Stewart
*Acting Director of the United States Patent and Trademark Office*